United States Patent [19]
Bae

[11] Patent Number: 5,698,347
[45] Date of Patent: Dec. 16, 1997

[54] RETICLE FOR OFF-AXIS ILLUMINATION

[75] Inventor: Sang Man Bae, Ichon-kun, Rep. of Korea

[73] Assignee: Hyundai Electronics Industries Co., Ltd., Ichon-kun, Rep. of Korea

[21] Appl. No.: 620,379

[22] Filed: Mar. 22, 1996

[30] Foreign Application Priority Data

Mar. 24, 1995 [KR] Rep. of Korea .................. 95-6327

[51] Int. Cl.⁶ .................................................. G03F 9/00
[52] U.S. Cl. ........................ 430/5; 430/322; 430/324
[58] Field of Search .............................. 430/5, 322, 324

[56] References Cited

U.S. PATENT DOCUMENTS 5,446,587  8/1995  Kang et al. ................................. 430/5
5,447,810  9/1995  Chen et al. ................................. 430/5

Primary Examiner—S. Rosasco
Attorney, Agent, or Firm—Reid & Priest L.L.P.

[57] ABSTRACT

A reticle for off-axis illumination which has spaces with different sizes wherein subsidiary patterns are formed at space patterns which are larger in size than the space of maximal focus latitude margin and thus, inappropriate for off-axis illumination, in such a way that the diffraction angle may be equivalent or similar in the total patterns of the reticle. Repetitively arranged, the subsidiary patterns are of dot shape or protuberance shape which have sizes insufficient to form image on the wafer. As a result, the marginal space is, in size, equivalent or similar to the pattern of the maximal focus latitude margin, thereby making small process margin available in large space patterns as large as the process margin available in small space patterns. Therefore, the progress allowance for semiconductor fabrication is enlarged uniformly, and a significant improvement is achieved in the reliability and process yield as well as in uniformity of the patterns.

14 Claims, 2 Drawing Sheets

RETICLE FOR OFF-AXIS ILLUMINATION

BACKGROUND OF THE INVENTION

1. Field of the Invention

The present invention relates, in general, to a reticle for off-axis illumination, useful for lithographic processes of semiconductor fabrication and, more particularly, to provision of additional subsidiary patterns for the spaces short of the depth of focus, among various spaces, thereby allowing them to have a similar or equivalent depth of focus to the other spaces.

2. Description of the Prior Art

Formation of photosensitive film patterns is curbed technically by various factors, such as precision of instrument and light wavelength. These factors limit the fineness of patterns achievable in semiconductor fabrication. For example, steppers which use, for example, G-line with a wavelength of 436 nm, i-line with a wavelength of 365 nm, or KrF exoimer laser with a wavelength of 248 nm as a light source show a limit of process resolution such that the pattern line or space is about 0.7 μm, 0.5 μm or 0.3 μm wide, correspondingly.

To form patterns finer than the optical resolution limits of the stepper, various efforts have been made, including: employment of X-ray steppers which use shorter optical wavelengths; improvement in precision of lens diameter and instruments; and use of phase-shift masks as a reticle.

In order to better understand the background of the invention, a description will be given of conventional techniques, with reference to some drawings.

As shown in FIGS. 1 and 2, a light 4 is vertically incident through a transparent substrate 5 to a reticle 1 in which light-screening patterns are formed. After going through the fine patterns 2 and 3 which are l' and l wide, respectively, the light is transmitted from a projection lens to a wafer at which images are formed.

When such vertically incident light passes through the slits between the patterns, it is diffracted and separated largely into zero order light 7 and first order light 6 under the influence of the narrow width of the patterns. Almost all light rays coming from the large slit width patterns 2 are on zero order or first order with a diffraction angle of $\theta_1$. While the light rays coming the fine patterns 3 are ±first order with a diffraction angle of $\theta_2$ larger than $\theta_1$. These ±first order lights have relatively large intensity, and a difference in optical path between the zero order light 7 and the ±first order light 6 is generated by the radius of curvature and focus distance of the projection lens, degenerating the image contrast.

To relieve this problem, either of the ±first lights is removed by an off-axis illumination method using a stepper equipped with a modified illumination aperture. This off-axis illumination method is illustrated in FIG. 3. As shown in FIG. 3, a light 10 vertically incident to a modified illumination aperture 12 passes through an off-axis illumination hole 11 of the aperture 12 and is incident to a reticle 13 at a tilted angle. After passing through the reticle 13, the light comes to have pattern images in addition to being separated into zero order light 7 and ±first order light 6 and 14 owing to diffraction. When the ±first order light 6 and 14 pass through a light-screening aperture 15, either of them is blocked (light 14 in FIG. 3 while the remaining one passes a projection lens 16 from which an image is projected on a wafer 17. In this case, the difference in optical path between the zero order light and the transmitted ±first order light 6 of 14 is resolved on the center of the radius of curvature of the projection lens 15, thereby improving process allowance.

Referring to FIG. 4, there is plotted the depth of focus as to the size of pattern. As apparent from this plot, such conventional off-axis illumination method is effective for fine pattern S1 which has a size suitable to separate the incident light into zero order light and the ±first order light, resulting in a significant improvement in image contrast. For relatively large pattern S2, however the conventional method, aggravates the image contrast. As represented by line 18 in FIG. 4, the depth of focus is degraded, which is attributed to the fact that the pattern S2 is too large for the incident light to be diffracted. In other words, the incident light is not separated, so that both of the ±first order light rays pass the projection lens, making the intensity of the light illuminated on the wafer different from intensities elsewhere.

SUMMARY OF THE INVENTION

Therefore, it is an object of the present invention to overcome the above problems encountered in the prior art and to provide a reticle for off-axis illumination by which fine patterns are formed with ease.

It is another object of the present invention to provide a reticle for off-axis illumination which allows image contrast to be improved.

It is a further object of the present invention to provide a reticle for off-axis illumination the use of which results in improvement in process allowance, process yield and reliability of operation.

Intensive research by the present inventors aiming to develop a reticle for off-axis illumination having such preferred properties as described above have resulted in finding that the provision of additional subsidiary patterns for the patterns having larger space rather than for patterns having optimum focus latitude margin leads to maximal focus latitude margin.

In accordance with the present invention, there is provided a reticle for off-axis illumination which has light-screening patterns with different spaces on a transparent substrate, wherein a plurality of subsidiary patterns are provided for and inside the patterns larger than those of minimal space and have sizes insufficient to form image, whereby the spaces can be the same in size.

BRIEF DESCRIPTION OF THE DRAWINGS

Other objects and aspects of the invention will become apparent from the following description of embodiments with reference to the accompanying drawings in which.

DETAILED DESCRIPTION OF THE INVENTION

Figure 1:
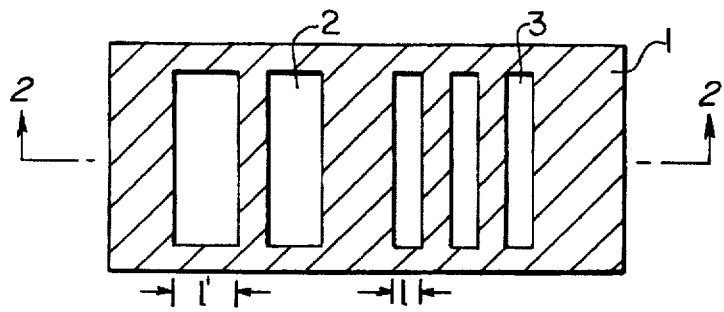
FIG. 1 is a schematic plan view showing a conventional reticle for off-axis illumination.
Figure 2:
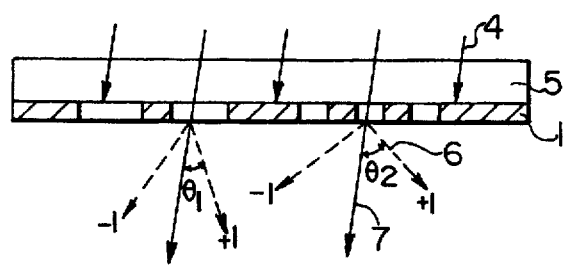
FIG. 2 is a schematic cross sectional view showing the conventional reticle, taken through line A–A' of FIG. 1.

The application of the preferred embodiments of the present invention is best understood with reference to the accompanying drawings, wherein like reference numerals are used for like and corresponding parts, respectively.

Figure 5:
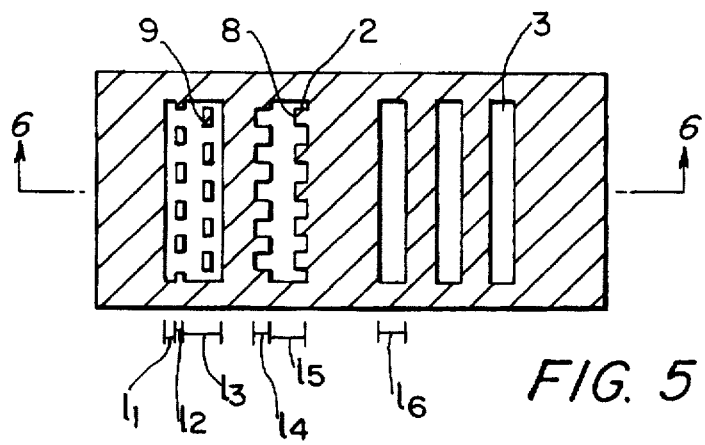
FIG. 5 is a schematic plan view showing a reticle for off-axis illumination according to the present invention.
Figure 6:
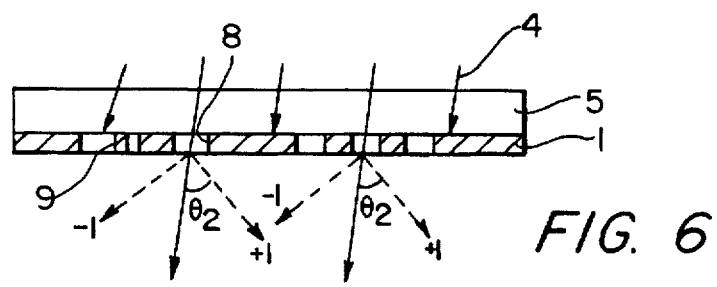
FIG. 6 is a schematic cross sectional view showing the reticle of the present invention, taken through line B–B' of FIG. 5.
Figure 3:
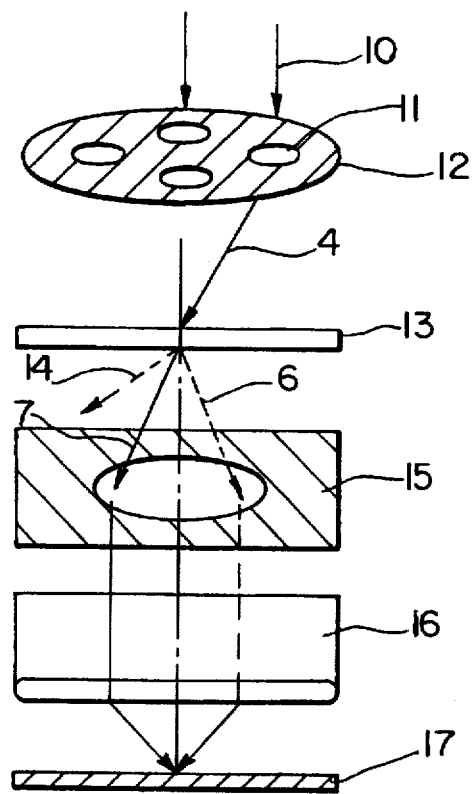
FIG. 3 is a schematic diagram showing an off-axis illumination apparatus.

FIG. 5 shows a reticle for off-axis illumination, according to the present invention while FIG. 6 is a cross sectional view, taken through line B–B' of FIG. 5.

As shown in FIG. 5, light-screening patterns 1 made from chrome, each with various space sizes, are formed on a transparent substrate 5, such as quartz, and patterns 2 which have a larger space $(1_1+1_2+1_3, 1_4+1_5)$ than that $(1_6)$ of patterns 3 with maximal focus latitude margin are also formed. For example, patterns 2 are 0.4 to 1.0 μm in size in the case of i-line stepper. For the patterns 2, subsidiary patterns 9 and 8 with dot shape or protuberance shape are provided.

The subsidiary patterns 8 and 9 are formed at such sizes $1_2$ and $1_4$, respectively, that cannot allow an image to be formed on the wafer. For example, upon exposure to i-line, the image projected on the wafer is formed in such a way that any of its sides ranges in size from 0.1 to 0.3 μm. The subsidiary patterns 8 and 9 are alternatively arranged at either or both of the space in such a way that the marginal space $1_3$ may have a dimension similar to that of the space $1_6$ of maximal focus latitude margin. In more detail, the small widths of the subsidiary patterns 8 and 9 are set to be half to four times as large as the light wavelength λ of the stepper. Preferably, $1_1$ is equivalent to $1_2$ in size.

In the same space, the subsidiary pattern 8 of protuberance shape may be provided together with the subsidiary pattern 9 of dot shape. Although, in FIG. 5, two rows of the subsidiary patterns 9 with dot shape are formed, each arranged alternatively, a plurality of rows can be applied to a pattern having large space.

Figure 4:
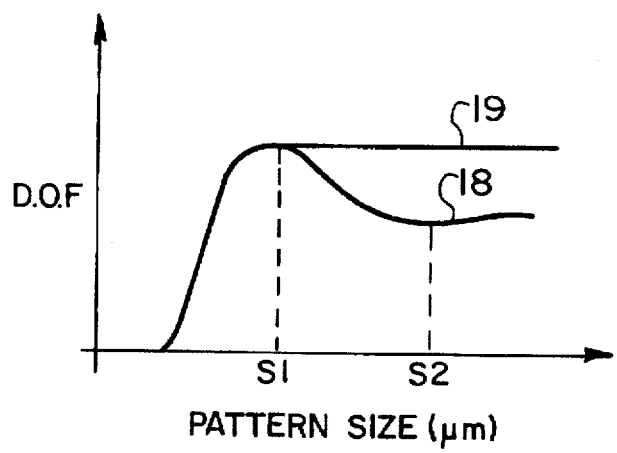
FIG. 4 is a graph showing the comparison of the depth of focus as to the size of space between the present reticle and conventional one.

The reticle equipped with such subsidiary patterns 8 and 9 shows the same depth of focus at various sizes of space, as represented by bold line 19 of FIG. 4.

The present invention can be applied for all of patterns formed over a memory region or peripheral circuit region, including a field oxide film pattern, as well as for a line/ space pattern. For example, in the case that the reticle for off-axis illumination of the present invention serves as a contact hole mask, the subsidiary patterns are formed inside the contact hole, with their dimension following the aforementioned conditions.

For the subsidiary patterns is used a shift phase material, SOG, a nitride film, TiN, a cured photoresist film or a translucent material with transmission of 1 to 10%.

As described hereinbefore, the reticle for off-axis illumination according to the present invention has spaces with different sizes wherein subsidiary patterns are formed at space patterns which are larger in size than the space of maximal focus latitude margin and thus, inappropriate for off-axis illumination, in such a way that the diffraction angle may be equivalent or similar in the total patterns of the reticle. Repetitively arranged, the subsidiary patterns are of dot shape or protuberance shape which have sizes insufficient to form an image on the wafer. As a result, the marginal space is equivalent or similar in size to the pattern of the maximal focus latitude margin, thereby making small process margin available in large space patterns as large as the process margin available in small space patterns. Therefore, the process allowance for semiconductor fabrication is enlarged uniformly, and a significant improvement is obtained in the reliability and process yield as well as in uniformity of the patterns.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A reticle for off-axis illumination comprising light-screening patterns defining spaces having differing widths such that there is at least one space of larger width and at least one space of smaller width, on a transparent substrate, wherein a plurality of subsidiary light screening patterns are provided inside the at least one space of larger width, and wherein said subsidiary patterns have sizes insufficient to form an image.

2. A reticle in accordance with claim 1, wherein said subsidiary patterns are half to 5 times as large as the wavelength λ of a light source.

3. A reticle in accordance with claim 1, wherein the spaces having said subsidiary patterns are 0.4 to 1.0 μm in size.

4. A reticle in accordance with claim 3, wherein said subsidiary patterns are of protuberance shape.

5. A reticle in accordance with claim 1, wherein said subsidiary patterns are of protuberance shape or dot shape, and are formed in a row.

6. A reticle in accordance with claim 1, wherein said subsidiary patterns are of dot shape, and are formed in multiple rows.

7. A reticle in accordance with claim 6, wherein the width of each row of subsidiary patterns is equivalent to the distance between the edge of said space of larger width and the closest row of subsidiary patterns.

8. A reticle in accordance with claim 1, wherein said subsidiary patterns are prepared from any one selected from the group consisting of phase shift materials, SOG, nitride films, TiN, cured photoresist films and translucent materials having a transmission of 1 to 10%.

9. A reticle in accordance with claim 1, wherein said reticle is a contact hole mask and said subsidiary patterns are formed at the edge within the contact holes, to form a desired diffraction angle.

10. A reticle in accordance with claim 1, wherein said space of smaller width is of maximal focus latitude margin.

11. A reticle in accordance with claim 10, wherein the spaces having differing widths are coplanar, and the subsidiary patterns are coplanar with the light-screening patterns defining the larger and smaller spaces.

12. A reticle in accordance with claim 11, wherein the spaces having said subsidiary patterns are 0.4 to 1.0 μm in size.

13. A reticle in accordance with claim 10, wherein, as a result of the provided subsidiary patterns, the marginal space of said space of larger width is equivalent to the maximal focus latitude margin.

14. A reticle in accordance with claim 1, wherein the spaces having differing widths are coplanar, and the subsidiary patterns are coplanar with the light-screening patterns differing the larger and smaller spaces.

* * * * *